United States Patent [19]

Goto et al.

[11] Patent Number: 4,509,249
[45] Date of Patent: Apr. 9, 1985

[54] METHOD FOR FABRICATING ISOLATION REGION IN SEMICONDUCTOR DEVICES

[75] Inventors: Hiroshi Goto, Yokohama; Akira Tabata, Zama, both of Japan

[73] Assignee: Fujitsu Ltd., Kawasaki, Japan

[21] Appl. No.: 535,342

[22] Filed: Sep. 23, 1983

[30] Foreign Application Priority Data

Sep. 29, 1982 [JP] Japan .................. 57-171977

[51] Int. Cl.³ .......................................... H01L 21/205
[52] U.S. Cl. .................. 29/576 W; 29/578; 29/580; 148/187
[58] Field of Search .............. 29/576 W, 578, 580; 148/187

[56] References Cited

U.S. PATENT DOCUMENTS

| | | | |
|---|---|---|---|
| 4,104,086 | 8/1978 | Bondur et al. | 29/578 |
| 4,233,091 | 11/1980 | Kawabe et al. | 29/576 W |
| 4,238,278 | 12/1980 | Antipov | 29/576 W |
| 4,255,207 | 3/1981 | Nicolay et al. | 148/187 X |

*Primary Examiner*—G. Ozaki
*Attorney, Agent, or Firm*—Staas & Halsey

[57] ABSTRACT

A method for fabricating an isolation region in a semiconductor substrate that produces neither a "bird's beak" nor a "bird's head". A smooth substrate surface is provided, which is preferable for multi-layered wiring. The packing density of devices in a bipolar IC circuit can be increased. A sharp-edged isolation groove having a U-shaped cross-section is made by reactive ion etching. The inner surface of the isolation groove is coated by an insulating film. Then the groove is buried with polycrystalline semiconductor material. The polycrystalline material which is deposited on the surface of the substrate is etched off. At the same time the polycrystalline material in the groove is also etched to a specific depth from the surface. An insulating film is then deposited so as to again fill the groove. Then the substrate surface is polished or etched to provide a flat surface.

18 Claims, 9 Drawing Figures

METHOD FOR FABRICATING ISOLATION REGION IN SEMICONDUCTOR DEVICES

BACKGROUND OF THE INVENTION

The present invention relates to a method for fabricating a region to isolate devices in a semiconductor substrate. More precisely, it involves fabricating isolation grooves that are filled with an insulating layer and polycrystalline semiconductor material. An isolation region fabricated by the method of the present invention has neither a "bird's beak" nor a "bird's head". Thus, a smooth surface is provided, which is preferable for multi-layered wiring in large scale integrated circuits (LSI).

In an integrated circuit (IC), many devices are formed on the same semiconductor substrate, and it is necessary to isolate these devices from each other. Isolation regions are therefore fabricated between the devices to isolate them from each other. Formerly isolation by a p-n junction was widely used, but the capacitance inherently included in the p-n junction decreased the speed of the circuit. As a result, dielectric isolation has become prevalent in recent ICs owing to its merits of low parasitic capacitance and high circuit performance.

Among dielectric isolation technologies, isolation with oxide and polycrystalline silicon (IOP) technology is widely used for bipolar ICs. This provides isolation grooves by etching between the devices and then filling the grooves with a layer of silicon dioxide ($SiO_2$) and polycrystalline silicon (polysilicon).

In the early IOP technology, a wet etching process was used and the cross-section of the isolation groove was V-shaped. This is due to the difference in etching rate depending on the direction of the crystal axis of the substrate. It recently became possible to make a groove having a U-shaped cross-section, by applying a dry etching technique.

This U-shaped groove is more preferable than the V-shaped groove because, for the U-shaped groove, the width of the groove can be made narrower compared to the V-shaped groove, for the same groove depth. Also, it can provide higher packing intensity of devices on an IC die. Therefore, the U-shaped isolation groove has recently become widely used.

However, for device isolation by a U-shaped groove, there are certain known defects which prevent high packing density of devices. These defects associated with a conventional process will now be explained, with respect to an example.

FIGS. 1, 2, 3 and 4 are schematic cross-sectional views of a process for fabricating U-shaped isolation regions in a semiconductor substrate by a known technology. FIG. 1 shows a silicon substrate 1 made of p-type silicon, and n+- and n-type silicon single-crystal layers 2 and 3, respectively, formed on the substrate 1 by diffusion and epitaxial growth technology.

On the surface of the n-type silicon layer 3, films of silicon dioxide ($SiO_2$) 4 and silicon nitride ($Si_3N_4$) 5 are formed successively. The $SiO_2$ film 4 protects the silicon layer 3 from flaws. By photolithographic etching, a window corresponding to a groove to be formed at a position 6 is provided in the silicon nitride film 5. Then, using the remaining film 5 of silicon nitride as a mask, the U-shaped groove is formed in the layers 2, 3 and in the substrate 1 at the position 6 by dry etching. Reactive ion etching is preferable for making a sharp U-shaped groove. The reactive ion etching will be described hereinafter. The remaining n+-layer 2 and the n-layer 3 of silicon are isolated by the grooves at the position 6. In subsequent processing the n+-layer 2 becomes a buried layer for a bipolar element, and the n-layer 3 becomes a zone in which the base and emitter are fabricated.

Next, as shown in FIG. 2, the surface of the substrate is oxidized, and the inner surface of the U-shaped groove at the position 6 is coated by a thin layer 7 of $SiO_2$. A layer of polysilicon (not shown) is then grown on the surface of the substrate. By this layer of polysilicon the groove is completely buried. Unwanted polysilicon on the surface of the substrate (not shown) is removed by polishing or etching, leaving the buried polysilicon 8 as shown in FIG. 2. By this etching process, the buried polysilicon 8 in the groove is slightly over-etched and leaves a depression as illustrated.

The substrate is then treated with a high temperature in the range of about 1000° to 1100° C. for a few hours. The upper part of the polysilicon 8 is thusly oxidized to form a $SiO_2$ layer 9 of about 1 micron thickness. By this oxidation the volume of polysilicon increases about a factor of two, and the concave surface of the polysilicon 8 heaves to form a convex projection as shown in FIG. 3.

The reason for making such a thick oxide layer 9 on the upper part of the U-shaped isolation groove at the position 6 is to realize a so-called "walled base" and "walled emitter" in the bipolar IC circuit. The thick oxide layer of this isolation region limits the length of the base and emitter, thus providing the base and emitter by a self-aligning method. The walled base and walled emitter will be described hereinafter. Another reason to provide the thick oxide layer is to decrease the stray capacitance of a wiring layer which is formed on the surface of this oxide layer.

FIG. 4 shows schematically a configuration of a walled base. The films of silicon nitride 5 in FIG. 3 are removed using boiling phosphoric acid ($H_3PO_4$), and the silicon dioxide 4 is removed by photolithography, exposing the base area 10. In this case the left hand side of the base area 10 is limited by the isolation region, so that the alignment of the mask for the base opening is not critical. In other words, it is self-aligned and the mask can extend onto the isolation region, such as to the point H' in FIG. 3. If the oxide layer 9 is sufficiently thick, it prevents the etching from exposing the buried polysilicon 8 at point C in FIG. 4. The emitter can also be self-aligned in the same manner at the left side of the base area 10. It is not shown in the figures for the sake of simplicity.

However, growing such a thick oxide layer 9 inherently produces a "bird's beak" B and a "bird's head" H as shown in FIG. 3. The bird's beak B is a thickened portion of the $SiO_2$ film that grows under the silicon nitride film 5, and the bird's head H is a $SiO_2$ film grown at the periphery of the groove which is heaved up by the oxidation of silicon at the side wall of the groove. The thicker the oxide layer 9 is grown, the larger they become.

Occasionally such a bird's head is heaved up to 0.8 microns and a bird's beak spreads to 1.5 micron. A bid's head increases the unevenness of the substrate surface, and makes it difficult to provide a multi-layered wiring on the surface. A bird's beak spreads laterally on the surface of the substrate, and decreases the packing density of devices, as a result of increasing the width of the isolation region between devices. Thus, all the effort to provide a sharp and narrow U-shaped isolation groove is counteracted to a great extent.

SUMMARY OF THE INVENTION

The object of the present invention, therefore, is to provide a method for fabricating an isolation region in a semiconductor substrate which has neither a bird's beak nor a bird's head. It provides a flat substrate surface which is preferable for multi-layered wiring, and contributes to increasing the packing density of devices in bipolar IC circuits.

The foregoing objects are accomplished by the following process. An isolation groove is made by reactive ion etching, and the inner surface of the isolation groove is coated by an insulating film. Then the groove is buried by polycrystalline semiconductor material. The polycrystalline semiconductor material which is deposited on the surface of the substrate is etched off from the surface and to a specific depth in the groove. An insulating film is grown again on the surface and so as to fill up the groove. Then the surface is polished or etched to provide a flat surface.

The process and the effects of the present invention will become clear from the accompanying drawings and the following detailed description.

BRIEF DESCRIPTION OF THE DRAWINGS

In the following drawings a cross-section of a substrate is shown schematically.

FIG. 1 shows schematically a cross-section of a substrate that is grooved by etching.

FIG. 2 is a cross-sectional view showing the groove subsequently buried by polycrystalline material.

FIG. 3 is a cross-sectional view showing the subsequent growing of a bird's beak and a bird's head.

FIG. 4 is a cross-sectional view of a device produced by the prior art technology, showing the self-aligned base.

FIG. 5 shows schematically a cross-section of a substrate grooved by etching, and the p+ dopant implanted at the bottom of the groove.

FIG. 6 is a cross-sectional view showing the groove subsequently buried by the polycrystalline semiconductor material.

FIG. 7 is a cross-sectional view showing the polycrystalline semiconductor material subsequently etched to a specific depth from the surface.

FIG. 8 is a cross-sectional view showing the groove subsequently buried again with an insulating film.

FIG. 9 shows a cross-sectional view in which the insulating film covering the surface is removed by polishing or etching.

DETAILED DESCRIPTION OF THE PREFERRED EMBODIMENTS

A preferred embodiment of the present invention will be disclosed with regard to the accompanying drawings. FIGS. 5 to 9 show schematically a cross-section of a substrate according to the process of the present invention for fabricating isolation regions.

Figure 5:
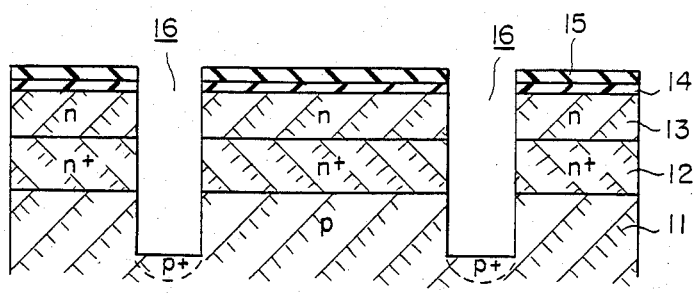
FIGS. 5 to 9 illustrate the process of making an isolation region by the present invention.

FIG. 5 shows a p-type silicon substrate 11, an n+-layer 12 that is highly doped by an n-type dopant and an n-layer 13, respectively formed on the substrate 11. Each of these layers 12 and 13 has a thickness of about 1.5 microns, and they are successively fabricated on the substrate 11 by diffusion and epitaxial growth methods.

In the following description a p-type silicon substrate is used as an example, but the type of substrate is not the essential matter of the present invention. The type of substrate may be altered to n-type, and the layers formed on the substrate may be of any type. The thickness of the layers may be also altered as desired, depending on the device design. Moreover, it will be understood that the material is not limited to silicon. The present process can be applied to any kind of semiconductor substrate for fabricating isolation regions between the devices formed in it.

A slice of a semiconductor crystal that is processed as described above is usually referred to as a substrate. In the description hereinafter, therefore, the word substrate will be used to denote a slice of semiconductor on which some of layers are formed for fabricating semiconductor devices.

The surface of the substrate is coated by a silicon dioxide ($SiO_2$) film 14 about 1000 Å thick. A silicon nitride ($Si_3N_4$) layer 15 about 2000 Å thick is then formed. These films are fabricated by methods such as thermal oxidation and chemical vapor deposition (CVD).

Then, by photolithographic etching, a window corresponding to the groove to be formed at the position 16 for the isolation region is opened in the $Si_3N_4$ film 15. Using the remaining $Si_3N_4$ film as a mask, a U-shaped groove of about 4 to 5 microns deep and about 2 to 3 microns wide is made by dry etching at the position 16. The dry etching applicable to this process is a reactive ion etching using a mixture of carbon tetrachloride ($CCl_4$) and boron trichloride ($BCl_3$). By the reactive etching (which is disclosed in U.S. Pat. No. 4,104,086 issued Aug. 1, 1978 to J. A. Bondur and H. G. Pogge) the side walls of the groove are etched vertically to shape a U-shaped groove. The bottom of the groove reaches to the p-type substrate 11 by cutting through both layers 12 and 13.

In an ordinary IC process as shown in FIG. 5, boron ions are implanted by ion implantation technology to form a p+-region highly doped by a p-type dopant at the bottom of the groove. This region is used as a channel stopper of the device, but it is not related explicitly to the present invention. Accordingly, in the further description and figures the channel stopper is omitted.

Figure 6:
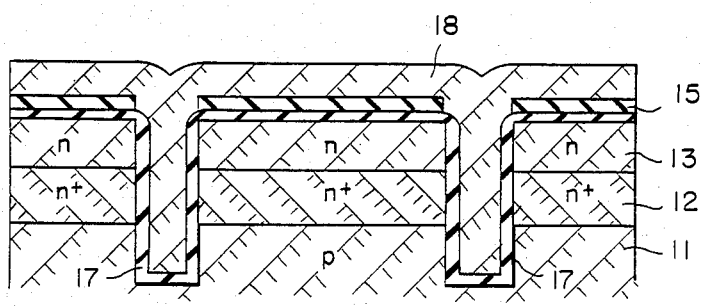

In the next step of the process, as shown in FIG. 6, the inner surface of the groove is coated with a $SiO_2$ film 17 by thermal oxidation, to a thickness of about 2000 to 3000 Å. Then an undoped polycrystalline semiconductor material such as polysilicon is deposited over the surface of the substrate, and the groove is buried thereby.

Figure 7:
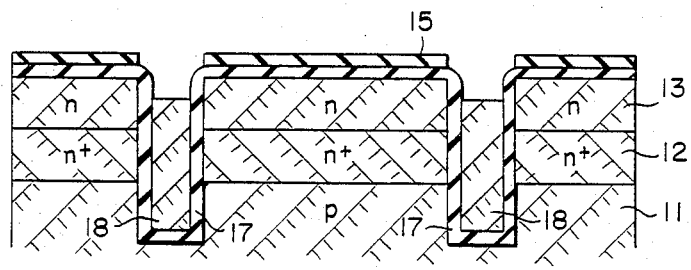

The polysilicon 18 deposited on the surface of the $Si_3N_4$ film 15 is removed by chemical wet etching as shown in FIG. 7. A commonly used etchant such as caustic potash (KOH) or a mixture of nitric acid ($HNO_3$) and hydrofluoric acid (HF) may be used. By this etching process the upper part of the polysilicon burying the groove is also etched. The depth of etching at the groove is controlled to about 0.5 to 1 micron from the surface of the $Si_3N_4$ film 15, although a shallower depth such as 0.2 microns is also possible. This control is not so critical but it is important for preventing a bird's beak and a bird's head from growing.

Figure 8:
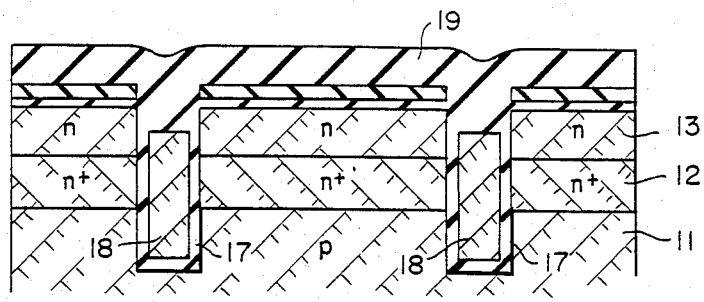

Next, as shown in FIG. 8, an insulating layer 19 such as a layer of $SiO_2$ is deposited on the surface of the substrate by a bias sputtering method. By this process the groove is buried again, but this time by SiO₂. Bias sputtering is a preferable method for depositing SiO₂ on the surface of a target which is electrically biased at about a hundred and a few tens of volts. It is an easy method for coating the inner surface of the groove with SiO₂ with a good coverage. The bias sputtering method is disclosed in Japanese Patent Application No. Tokukaisho 55-13904 by Tsunekawa et al. This bias sputtering process may be replaced by an ordinary CVD method.

Figure 9:
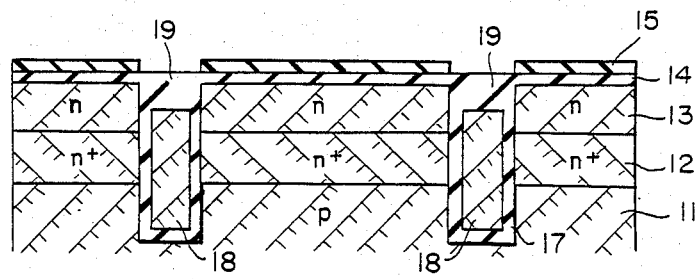

Next, as shown in FIG. 9, the SiO₂ film deposited on the surface of the Si₃N₄ film 15 is removed by etching. A wet etching by hydrofluoric acid or a dry etching using trifluoromethane gas are applicable. These etching methods are effective for the SiO₂ deposited by the aforementiond bias sputtering method. For the SiO₂ deposited by a chemical vapor deposition process, chemical polishing is effective for the same purpose. The Si₃N₄ is removed with boiling phosphoric acid (H₃PO₄).

Figure 1:
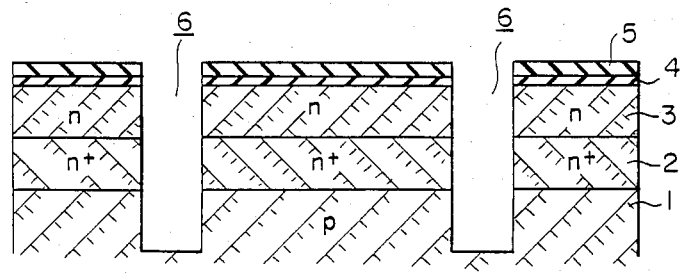
FIGS. 1 to 4 illustrate the prior art technology.
Figure 2:
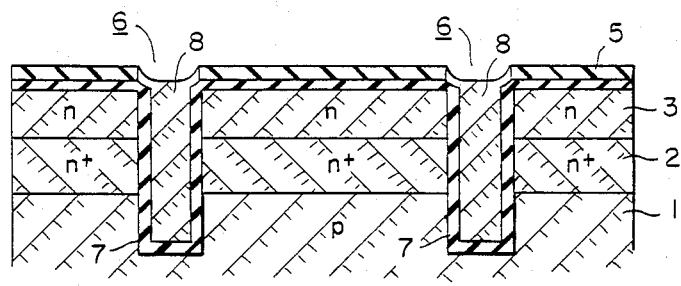
Figure 3:
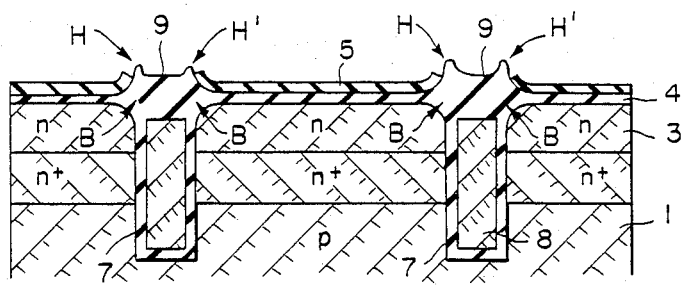
Figure 4:
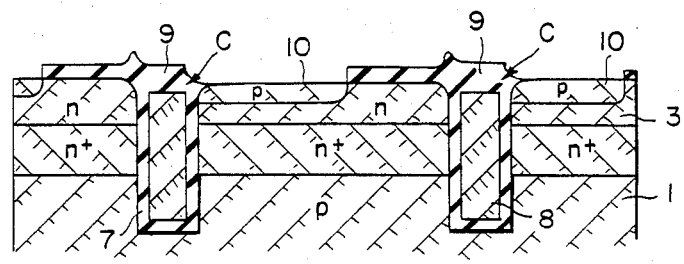

Comparing FIG. 9 with FIG. 3, it will be apparent that an isolation region fabricated by the present invention has neither a bird's beak nor a bird's head. A self-aligned walled base and walled emitter can be applied without any change in the ordinary process. The polysilicon 18 is buried deep in the SiO₂ film 19. Accordingly, there is no need for anxiety that the polysilicon may be exposed by the etching of the above process to cause leakage in an electric circuit of a device.

A smooth surface is provided that is preferable for multilayered wiring. It will be clear that the packing density of devices in an IC can be increased to a greater extent than with conventional isolation grooves.

As has been described in the above explanation, the present invention does not need any new or special process to provide an isolation region. Further, it can be applied to any type of device.

What is claimed is:

1. A method for fabricating an isolation region in a semiconductor device formed with a semiconductor substrate having a U-shaped isolation groove, comprising:
    coating said isolation groove with a first insulating layer;
    filling the coated groove with polycrystalline semiconductor material at least to a first depth below the surface of said substrate; and
    depositing a second insulating layer on said polycrystalline semiconductor material so as to at least fill said isolation groove up to said substrate surface.

2. The method of claim 1, comprising, prior to depositing said second insulating layer:
    continuing said filling of said coated groove with said polycrystalline semiconductor material to fill said coated groove above said first depth; and
    etching said polycrystalline semiconductor material in said coated groove down to said first depth.

3. The method of claim 2, said filling of said coated groove with said polycrystalline semiconductor material also comprising depositing said polycrystalline semiconductor material on said substrate surface, said method comprising continuing said filling of said coated groove with said polycrystalline semiconductor material so as to bury said isolation groove, prior to said etching of said polycrystalline semiconductor material to said first depth.

4. The method of claim 2 or 3, said etching of said polycrystalline semiconductor material comprising a wet etching process.

5. The method of claim 1, 2 or 3, comprising forming said first depth to be in the range from 0.2 to 1 micron from said substrate surface.

6. The method of claim 1, 2 or 3, comprising providing said substrate to be of silicon, each said insulating layer to be of silicon dioxide, and said polycrystalline semiconductor material to be of silicon.

7. The method of claim 1, 2 or 3, wherein the top surface of said second insulating layer provides said substrate surface with an effectively flat surface in the vicinity of the isolation region and the isolation region is provided with a width that is effectively the width of the isolation groove.

8. The method of claim 1, 2 or 3, said depositing of said second insulating layer including coating the surface of said substrate with said second insulating layer, said method further comprising:
    continuing said depositing of said second insulating layer so as to bury said coated groove; and
    removing said second insulating layer on said substrate surface and from above said substrate surface over said isolation groove.

9. The method of claim 8, comprising providing said substrate to be of silicon, each said insulating layer to be of silicon dioxide, and said polycrystalline semiconductor material to be of silicon.

10. the method of claim 8, said removing of said second insulating layer comprising at least one of etching and polishing.

11. The method of claim 8, wherein the top surface of said second insulating layer provides said substrate surface with an effectively flat surface in the vicinity of the isolation region and the isolation region is provided with a width that is effectively the width of the isolation groove.

12. The method of claim 8, comprising forming said first depth to be in the range from 0.2 to 1 micron from said substrate surface.

13. The method of claim 12, comprising providing said first depth to be at least 0.5 microns.

14. The method of claim 8, said method comprising
    forming said substrate of a slice of single crystal semiconductor with at least one layer of doped semiconductor as the top of the slice and a semiconductor oxide layer on the top doped layer,
    forming said isolation groove to be deeper than each said doped layer, and
    forming the thickness of said layer of semiconductor oxide to be smaller than said first depth.

15. The method of claim 14, comprising
    forming a layer of semiconductor nitride on said layer of semiconductor oxide, prior to said coating of said groove with said first insulating layer, and
    removing said layer of semiconductor nitride after said removing of said second insulating layer.

16. The method of claim 15, comprising providing the thickness of said layer of silicon nitride to be smaller than said first depth.

17. The method of claim 15, wherein the top surface of said second insulating layer provides said substrate surface with an effectively flat surface in the vicinity of the isolation region abd the isolation region is provided with a width that is effectively the width of the isolation groove.

18. The method of claim 15, comprising providing said substrate and said polycrystalline semiconductor material to be of silicon, each said insulating layer and said layer of semiconductor oxide to be of silicon oxide (SiO₂), and said semiconductor nitride to be of silicon nitride.

* * * * *

UNITED STATES PATENT AND TRADEMARK OFFICE
CERTIFICATE OF CORRECTION

PATENT NO. : 4,509,249

DATED : April 9, 1985

INVENTOR(S) : Hiroshi Goto et al

It is certified that error appears in the above-identified patent and that said Letters Patent is hereby corrected as shown below:

Col. 2, line 63, "bid's head" should be --bird's head--.

Claim 17, line 4, "abd" should be --and--.

Signed and Sealed this

Tenth Day of September 1985

[SEAL]

Attest:

DONALD J. QUIGG

Attesting Officer     Acting Commissioner of Patents and Trademarks - Designate

Notice of Adverse Decision in Interference

In Intererence No. 101,627, involving Patent No. 4,509,249, H. Goto and A. Tabata, METHOD FOR FABRICATING ISOLATION REGION IN SEMICONDUCTOR DEVICES, final judgment adverse to the patentees was rendered March 1, 1989, as to claims 1-18.
[*Official Gazette September 19, 1989.*]

UNITED STATES PATENT AND TRADEMARK OFFICE
CERTIFICATE OF CORRECTION

PATENT NO. : 4,509,249
DATED : April 9, 1985
INVENTOR(S) : HIROSHI GOTO et al

It is certified that error appears in the above-identified patent and that said Letters Patent is hereby corrected as shown below:

Title page:

(73) Assignee, change "Fujitsu Ltd." to --Fujitsu Limited--.

Signed and Sealed this

Third Day of October, 1989

Attest:

DONALD J. QUIGG

Attesting Officer

Commissioner of Patents and Trademarks